(12) United States Patent
Matsufuji

(10) Patent No.: US 11,527,388 B2
(45) Date of Patent: Dec. 13, 2022

(54) MEMBER FOR PLASMA PROCESSING DEVICES

(71) Applicant: KYOCERA Corporation, Kyoto (JP)

(72) Inventor: Hiromasa Matsufuji, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 507 days.

(21) Appl. No.: 16/633,351

(22) PCT Filed: Jul. 27, 2018

(86) PCT No.: PCT/JP2018/028321
§ 371 (c)(1),
(2) Date: Jan. 23, 2020

(87) PCT Pub. No.: WO2019/022244
PCT Pub. Date: Jan. 31, 2019

(65) Prior Publication Data
US 2020/0152422 A1    May 14, 2020

(30) Foreign Application Priority Data
Jul. 28, 2017  (JP) .............................. JP2017-146772

(51) Int. Cl.
*H01J 37/32*       (2006.01)
*C04B 35/117*     (2006.01)
(Continued)

(52) U.S. Cl.
CPC ........ *H01J 37/3244* (2013.01); *C04B 35/117* (2013.01); *C04B 41/80* (2013.01); *F16L 9/10* (2013.01); *H01J 37/32009* (2013.01); *C04B 2235/3206* (2013.01); *C04B 2235/3208* (2013.01); *C04B 2235/3217* (2013.01); *C04B 2235/3418* (2013.01); *C04B 2235/5436* (2013.01); *C04B 2235/85* (2013.01);
(Continued)

(58) Field of Classification Search
CPC ............ H01L 21/67069; C04B 35/111; C04B 35/117; F16L 9/10
See application file for complete search history.

(56) References Cited

U.S. PATENT DOCUMENTS 6,258,440 B1    7/2001   Aihara et al.
10,920,318 B2*  2/2021   Noguchi ............... C04B 37/003
(Continued)

FOREIGN PATENT DOCUMENTS

JP    H10-167859 A    6/1998
JP    2001-250814 A   9/2001
(Continued)

*Primary Examiner* — Karl E Group
(74) *Attorney, Agent, or Firm* — Procopio Cory Hargreaves and Savitch LLP

(57) ABSTRACT

A member for a plasma processing device of the present disclosure is a member for a plasma processing device made of ceramics and having a shape of a cylindrical body with a through hole in an axial direction. The ceramics is mainly composed of aluminum oxide, and has a plurality of crystal grains and a grain boundary phase that is present between the crystal grains. An inner peripheral surface of the cylindrical body has an arithmetic average roughness Ra of 1 μm or more and 3 μm or less, and an arithmetic height Rmax of 30 μm or more and 130 μm or less.

3 Claims, 2 Drawing Sheets

(51) Int. Cl.
 F16L 9/10 (2006.01)
 C04B 41/80 (2006.01)
 H01L 21/67 (2006.01)

(52) U.S. Cl.
 CPC .... *C04B 2235/94* (2013.01); *C04B 2235/963* (2013.01); *C04B 2235/9669* (2013.01); *H01J 2237/006* (2013.01); *H01J 2237/334* (2013.01); *H01L 21/67069* (2013.01)

(56) References Cited

U.S. PATENT DOCUMENTS

2007/0054092 A1    3/2007  Harada et al.
2018/0312974 A1*   11/2018  Noguchi ............... B28B 11/243

FOREIGN PATENT DOCUMENTS

| JP | 2008-156160 A | 7/2008 |
| KR | 2007-0029094 A | 3/2007 |
| WO | 2017/073679 A1 | 5/2017 |

* cited by examiner

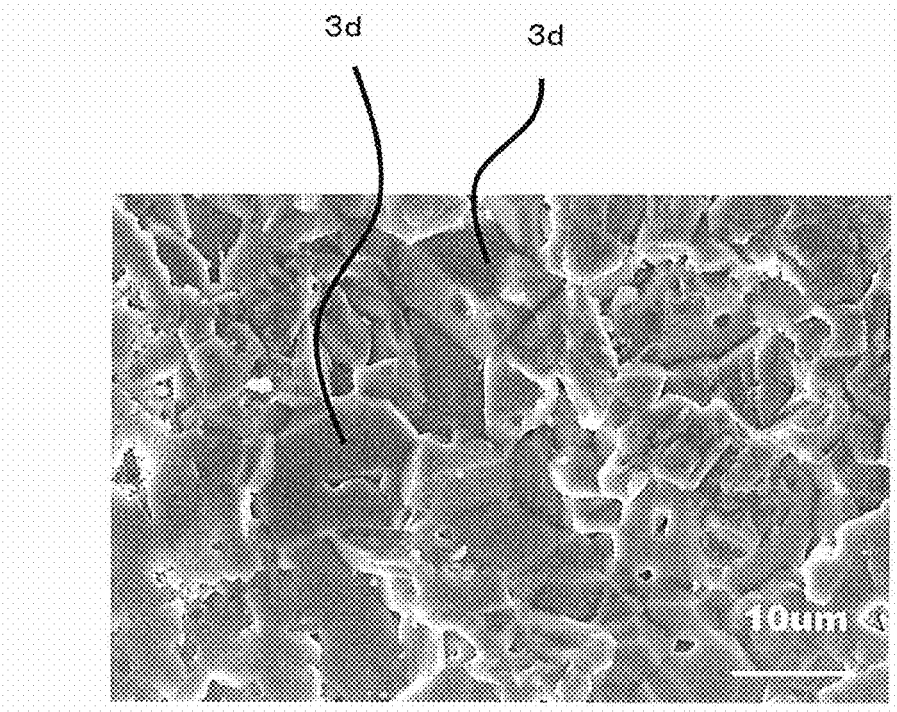

MEMBER FOR PLASMA PROCESSING DEVICES

TECHNICAL FIELD

The present disclosure relates to a member for a plasma processing device used in a plasma processing device.

BACKGROUND ART

Conventionally, when manufacturing a semiconductor device, a plasma processing device is used to form a fine pattern by etching a thin film on a substrate. A member for a plasma processing device that supplies plasma generating gas to the plasma processing device is required to have high corrosion resistance with respect to the plasma generating gas in order to suppress generation of particles that causes loss of the fine pattern. Patent Document 1 describes that the corrosion resistance is improved by mechanically processing a ceramic component that comes into contact with corrosive gas and then heat treating the same. This ceramic component is formed by mechanically processing ceramics using a drill or the like after sintering. Accordingly, crystal grains exposed on an inner peripheral surface are mechanically destroyed, and pressing force between the adjacent crystal grains is reduced due to cracks or the like generated in the crystal grains, causing the crystal grains to be easily dropped. In addition, a grain boundary phase is easily brought into contact with the plasma generating gas.

RELATED ART DOCUMENT

Patent Document

Patent Document 1: JP H10-167859 A

SUMMARY OF THE INVENTION

A member for a plasma processing device of the present disclosure is a member for a plasma processing device made of ceramics and having a shape of a cylindrical body with a through hole in an axial direction. The ceramics is mainly composed of aluminum oxide, and has a plurality of crystal grains and a grain boundary phase that is present between the crystal grains. An inner peripheral surface of the cylindrical body has an arithmetic average roughness Ra of 1 µm or more and 3 µm or less, and an arithmetic height Rmax of 30 µm or more and 130 µm or less.

BRIEF DESCRIPTION OF THE DRAWINGS

FIG. 2 is a scanning electron micrograph of an inner peripheral surface of the member for a plasma processing device shown in FIG. 1.

EMBODIMENT FOR CARRYING OUT THE INVENTION

Figure 1:
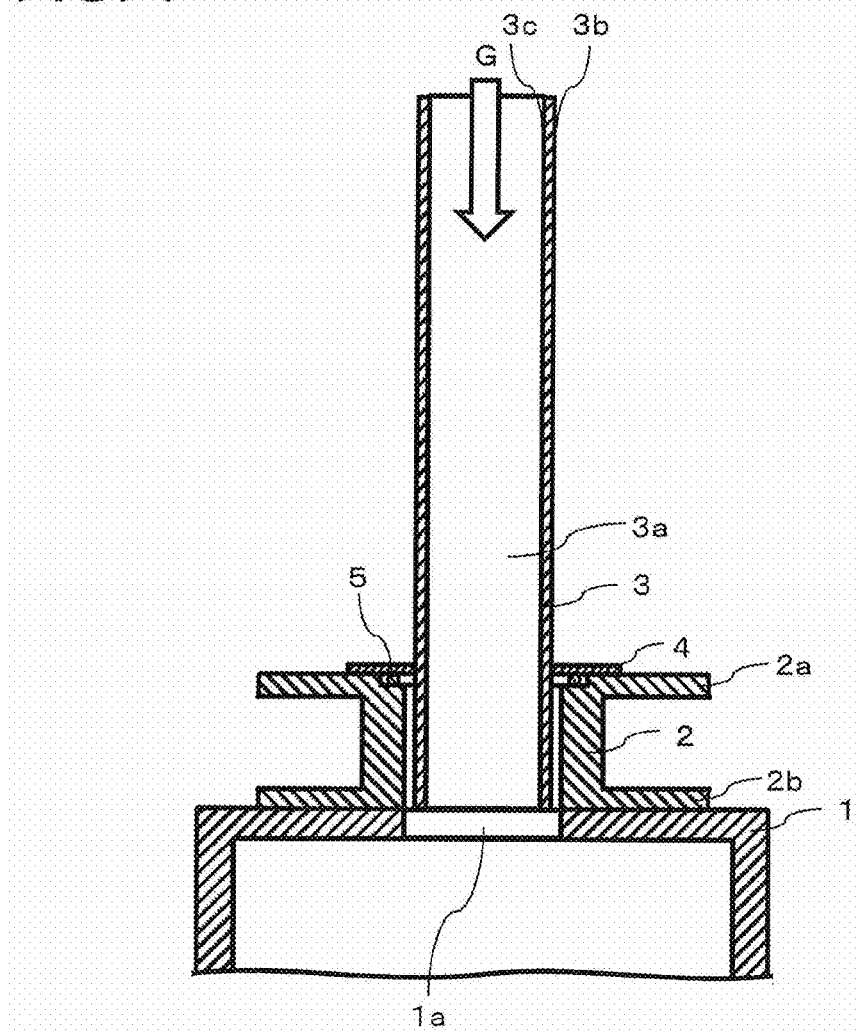
FIG. 1 is a cross-sectional view showing a part of a plasma processing device using a member for a plasma processing device of the present embodiment.

A member for a plasma processing device according to the present invention is described with reference to the drawings.

FIG. 1 is a cross-sectional view showing a part of a plasma processing device using a member for a plasma processing device of the present embodiment.

The plasma processing device shown in FIG. 1 includes a chamber 1 having a member to be processed (not shown) arranged in an internal space thereof, and performs various types of processing such as pattern formation processing using plasma and cleaning processing on the member to be processed. On an opening part 1a of the chamber 1, an annular member 2 having flanges 2a and 2b at both ends is airtightly fixed to the chamber 1.

In the internal space of the annular member 2, there is arranged a member 3 for a plasma processing device made of ceramics and having a shape of a cylindrical body with a through hole 3a in an axial direction, and a flange part 4 is bonded to an outer peripheral surface 3b of the member 3 for a plasma processing device. The flange part 4 is joined to the annular member 2 with an O-ring 5 interposed therebetween to prevent intrusion of air into the chamber 1 and to fix the member 3 for a plasma processing device to the annular member 2.

When various types of processing are performed on the member to be processed using the plasma processing device having the above configuration, the plasma generating gas is supplied from an upper opening part of the member 3 for a plasma processing device toward the chamber 1 through the through hole 3a, and is brought into contact with an inner peripheral surface 3c forming the through hole 3a of the member 3 for a plasma processing device.

Examples of the plasma generating gas include fluorine-based gas such as $SF_6$, $CF_4$, $CHF_3$, $ClF_3$, $NF_3$, $C_4F_8$, and HF, and chlorine-based gas such as $Cl_2$, HCl, $BCl_3$, and $CCl_4$.

The ceramics that constitutes the member 3 for plasma processing device of the present disclosure and comes into contact with the above gases are mainly composed of aluminum oxide. Aluminum oxide has high corrosion resistance against the plasma generating gas.

Here, the main component in the present embodiment refers to the most abundant component in total of 100% by mass of all the components constituting the ceramics, and it is particularly preferable that the main component account for 90% by mass or more, and further, 98% by mass. Each component is identified by an X-ray diffractometer using CuKα radiation, and the content of each component may be determined by, for example, an inductively coupled plasma (ICP) emission spectroscopic analyzer or a fluorescent X-ray analyzer.

Examples of the component forming a grain boundary phase of the ceramics include oxides of silicon, magnesium and calcium.

The ceramics constituting the member 3 for plasma processing device is a so-called sintered body, and has a plurality of crystal grains and the grain boundary phase existing between the crystal grains. The crystal grain is composed of a crystal having the above-mentioned main component, and generally, the grain boundary phase is inferior in corrosion resistance to the plasma generating gas than the crystal grain.

FIG. 2 is a scanning electron micrograph of the inner peripheral surface 3c of the member 3 for a plasma processing device shown in FIG. 1.

As shown in FIG. 2, the member 3 for a plasma processing device has a plurality of crystal grains 3d on the inner peripheral surface 3c forming the through hole 3a. Further, the member has a grain boundary phase (not shown) that exists between the crystal grains 3d.

The inner peripheral surface 3c of the member 3 for a plasma processing device of the present disclosure has an arithmetic average roughness Ra of 1 μm or more and 3 μm or less, and an arithmetic height Rmax of 30 μm or more and 130 μm or less.

The arithmetic average roughness Ra of the inner peripheral surface 3c of the member 3 for a plasma processing device of the present disclosure is larger than that of a general grinding surface. Usually, the arithmetic height Rmax is about 4 times the arithmetic average roughness Ra, but the arithmetic height Rmax of the inner peripheral surface 3c of the cylindrical body of the member 3 for a plasma processing device of the present embodiment is 6.7 times or more the arithmetic average roughness Ra.

Because the member 3 for a plasma processing device of the present disclosure has the arithmetic height Rmax of the inner peripheral surface 3c of 30 μm or more, the plasma generating gas flowing through the through hole 3a becomes difficult to come into contact with an exposed part of the grain boundary phase having a relatively low corrosion resistance against the plasma generating gas. As a result, dropping of the grains that occurs due to corrosion of the exposed part of the grain boundary phase can be suppressed, and generation of particles can be reduced.

In addition, because the arithmetic height Rmax is 130 μm or less, the plasma generating gas is easy to flow smoothly as a laminar flow along the inner peripheral surface 3c, and as a result, the corrosion of the exposed part of the grain boundary phase can be suppressed.

In addition to the arithmetic average roughness Ra, the arithmetic height Rmax can be adjusted by appropriately adjusting a raw material grain diameter and heat treatment time after sintering.

For example, as the raw material grain diameter decreases, the arithmetic roughness Ra and the arithmetic height Rmax tend to decrease. As the heat treatment time increases, the arithmetic roughness Ra and the arithmetic height Rmax tend to increase.

Further, an average value of kurtosis Rku on the inner peripheral surface 3c of the member 3 for a plasma processing device may be 6 or more.

Here, the kurtosis Rku is an index representing kurtosis, which is a measure of surface sharpness. And when the kurtosis Rku is 3, it indicates that the kurtosis of a portion that becomes a peak and a portion that becomes a valley in the surface is in a state of normal distribution. On the other hand, when the kurtosis Rku is greater than 3, the vicinities of apexes of the portions to be peaks and valleys become pointed, and when the kurtosis Rku is less than 3, the vicinities of the apexes of the peaks and valleys become crushed.

When the average value of kurtosis Rku is 6 or more, a recessed part that exists on the inner peripheral surface 3c becomes deep, and when this recessed part corresponds to the grain boundary phase, the plasma generating gas becomes difficult to come into contact with the exposed part of the grain boundary phase, and accordingly, the corrosion of the exposed part is suppressed. The recessed part is a part of the portion that becomes the valley of the inner peripheral surface 3c.

The average value of kurtosis Rku obtained from a roughness curve on the inner peripheral surface 3c of the member 3 for a plasma processing device may be 9 or less.

When the average value of kurtosis Rku exceeds 9, the recessed part of the inner peripheral surface 3c becomes deep, and when this recessed part corresponds to the grain boundary phase, force at which the grain boundary phase binds the crystal grains 3d together tends to be weakened. In such a case, if the plasma generating gas flows through the through hole 3a, there is a high possibility that the crystal grain 3d and a part thereof will fall off.

When the average value of kurtosis Rku is 6 or more and 9 or less, the corrosion of the exposed part is suppressed even when the plasma generating gas flows through the through hole 3a, and the crystal grain 3d and a part thereof are prevented from dropping.

The kurtosis Rku may be determined using a laser microscope VK-9500 conforming to JIS B 0601: 2001 and manufactured by, for example, Keyence Corporation. When a laser microscope VK-9510 is used, for example, a measurement mode is set to color super-depth, a measurement magnification to 400 times, a measurement range per location to 112 μm×84 μm, a measurement pitch to 0.05 μm, a cutoff filter λs to 2.5 μm, a cutoff filter λc to 0.08 mm, and measurement locations to 8 locations.

Further, the inner peripheral surface 3c of the member 3 for a plasma processing device of the present disclosure may be a burned skin surface. If the inner peripheral surface 3c is the burned skin surface, grinding debris does not adhere to the inner peripheral surface 3c and accordingly, generation of particles caused by the grinding debris dropping from the inner peripheral surface 3c can be suppressed.

The inner peripheral surface 3c has a projected part composed of aluminum oxide crystal grains 3d, and as shown in FIG. 2, a surface of the projected part may include a plurality of planes. Because the inner peripheral surface 3c has the above configuration, the plasma generating gas becomes easy to flow smoothly as a laminar flow along the inner peripheral surface 3c, and as a result, the corrosion of the exposed part of the grain boundary phase is further suppressed.

In order to form the above aluminum oxide crystal grains 3d including the plurality of planes on the inner peripheral surface 3c, for example, the heat treatment after sintering is lengthened to make an outer shape of the aluminum oxide crystal grain 3d approach that of a hexagonal single crystal.

The above configuration can be observed using a scanning electron microscope with the measurement magnification of 2000 times and the measurement range per location of 64 μm×42 μm.

Moreover, the ceramics may contain magnesium aluminate. When the grain boundary phase contains magnesium aluminate, corrosion resistance of the grain boundary phase against the fluorine-based gas is improved. Further, because magnesium aluminate has high corrosion resistance against hydrofluoric acid, the corrosion resistance in removing and washing the member 3 for a plasma processing device with hydrofluoric acid is improved.

Next, an example of a manufacturing method of the member for a plasma processing device of the present disclosure is described.

First, aluminum oxide powder as a main component, powder of each of magnesium hydroxide, silicon oxide, and calcium carbonate, and as required, a dispersant for dispersing aluminum oxide powder, and an organic binder are wet mixed in a ball mill, bead mill, or vibration mill to form a slurry.

When the time of wet mixing is lengthened, even if the same raw material powder is used, the grain diameter becomes small, and the arithmetic roughness Ra and the arithmetic height Rmax of the inner peripheral surface tend to increase.

Here, the average grain diameter ($D_{50}$) of the aluminum oxide powder is 1.6 μm or more and 2.0 μm or less, and in total of 100% by mass of the above powder, the content of magnesium hydroxide powder is 0.43 to 0.53% by mass, the content of silicon oxide powder is 0.039 to 0.041% by mass, and the content of calcium carbonate powder is 0.020 to 0.022% by mass.

The time of wet mixing is, for example, 40 to 50 hours. Examples of the organic binder include paraffin wax, wax emulsion (wax+emulsifier), polyvinyl alcohol (PVA), polyethylene glycol (PEG), polyethylene oxide (PEO), and the like.

Next, after the slurry obtained by the above-mentioned method is spray-granulated to obtain granules, the granules are molded by a powder press molding method, a hydrostatic pressure molding method (rubber pressing method), or the like, and thereby a cylindrical molded body is obtained.

Next, a through hole is formed in the axial direction using a drill made of sintered diamond. In the process of forming the through hole, if the speed of forming the through hole is increased, the inner peripheral surface of the through hole is roughened, causing the arithmetic average roughness Ra and the arithmetic height Rmax to easily increase, and in particular, causing the arithmetic height Rmax to easily increase.

Next, the molded body in which the through hole is formed is sintered in an air atmosphere, for example, at a temperature raising rate of 80° C./hour or more and 120° C./hour or less, a sintering temperature of 1500° C. or more and 1700° C. or less, a holding time of 4 hours or more and 6 hours or less, and a temperature lowering rate of 80° C./hour or more and 120° C./hour or less, and thereby the member for a plasma processing device of the present embodiment can be obtained.

In order to obtain ceramics containing aluminum oxide as the main component and containing magnesium aluminate, in total of 100% by mass of aluminum oxide powder as the main component and powder of each of magnesium hydroxide, silicon oxide, and calcium carbonate, the content of magnesium hydroxide may be set to 0.48 to 0.53% by mass, the content of silicon oxide powder to 0.039 to 0.041% by mass, and the content of calcium carbonate powder to 0.020 to 0.022% by mass.

The inner peripheral surface forming the through hole may be formed as the burned skin surface without being machined, after forming the through hole by machining the molded body and being sintered.

Also, by using methods of increasing the sintering temperature, lengthening the sintering time, or performing heat treatment after sintering and thereby encouraging grain growth of each of the crystal grains, the arithmetic height Rmax of the inner peripheral surface can be increased.

In order to obtain the member for a plasma processing device in which the average value of kurtosis Rku of the roughness curve of the inner peripheral surface of the cylindrical body is 6.0 or more, the heat treatment may be performed so as to allow the crystal of aluminum oxide to undergo grain growth after sintering, and for example, the heat treatment may be performed at the temperature raising rate of 80° C./hour or more and 120° C./hour or less, a heat treatment temperature of 1300° C. or more and 1500° C. or less, the holding time of 2 hours or more and 4 hours or less, and the temperature lowering rate of 80° C./hour or more and 120° C./hour or less.

The present disclosure is not limited to the above-described embodiment, and various changes, improvements, combinations, and the like can be made without departing from the scope of the present disclosure.

In the example shown in FIG. 1, the member for a plasma processing device is shown as a member that supplies the plasma generating gas to the chamber. However, it may be a member that discharges the plasma generating gas from the chamber, or a nozzle that is disposed in the chamber and generates stable plasma from the plasma generating gas.

Example 1

First, aluminum oxide powder as a main component, powder of each of magnesium hydroxide, silicon oxide, and calcium carbonate, and as required, a dispersant for dispersing aluminum oxide powder, and an organic binder were wet mixed in a ball mill to form a slurry.

Here, the average grain diameter ($D_{50}$) of the aluminum oxide powder was set to 1.8 μm, and in total of 100% by mass of the above powder, the content of magnesium hydroxide powder was set to 0.48% by mass, the content of silicon oxide powder was set to 0.04% by mass, and the content of calcium carbonate powder was set to 0.021% by mass.

Next, the slurry obtained by the above-mentioned method was spray-granulated to obtain granules, and thereafter, the granules were molded by the powder press molding method to obtain a cylindrical molded body.

Next, a through hole was formed in the axial direction using the drill made of sintered diamond.

Next, the molded body in which the through hole was formed was placed in a sintering furnace, and sintered in the air atmosphere at the sintering temperature of 1600° C. and the holding time of 5 hours.

In addition, some samples were heat treated after sintering at the temperature raising rate of 100° C./hour, the heat treatment temperature of 1400° C., the holding time as shown in Table 1, and the temperature lowering rate of 100° C./hour, and sample Nos. 2 to 9 which are members for a plasma processing device were obtained.

The inner peripheral surfaces of these samples Nos. 2 to 9 are burned skin surfaces.

As a comparative example, a sample No. 1 in which the inner peripheral surface of the member for a plasma processing device was ground was obtained. The inner peripheral surface of the sample No. 1 is a ground surface.

Then, each sample was sequentially treated with washing with potassium hydroxide and a surfactant, ultrasonic cleaning, acid cleaning, and ultrasonic cleaning.

Thereafter, there was connected a hose for pure water supply to the opening part on one side of the through hole of each sample, and a container to the opening part of the other side thereof, respectively. Next, with a flow rate of 5 mL/second, pure water was supplied from the hose for 100 seconds, and the number of particles contained in the pure water discharged into the container was measured using a liquid particle counter. The particle to be measured was assumed to have a diameter exceeding 0.2 μm. In addition, the container was subjected to ultrasonic cleaning before being connected, and as the container, one that was confirmed to have 20 or less particles having a diameter exceeding 0.2 μm was used.

Here, the number of particles generated from each sample is shown as a relative value when the number of particles generated from the sample No. 1 is 1. The results are shown in Table 1.

Moreover, as a result of analyzing a component constituting each sample by the X-ray diffraction apparatus using CuKα radiation, aluminum oxide was identified. Further, as a result of measuring the content of each metal element with an inductively coupled plasma (ICP) emission spectroscopic analyzer, it was found that the content of aluminum is the largest and aluminum oxide is the main component.

Further, the arithmetic average roughness Ra and the arithmetic height Rmax of the inner peripheral surface of each sample were determined using the laser microscope VK-9500 conforming to JIS B 0601: 2001 and manufactured by Keyence Corporation. As measurement conditions, the measurement mode was set to color super-depth, the measurement magnification to 400 times, the measurement range per location to 112 μm×84 μm, the measurement pitch to 0.05 μm, the cutoff filter λs to 2.5 μm, and the cutoff filter λc to 0.08 mm, whereby the arithmetic average roughness Ra and the arithmetic height Rmax were obtained. The values are shown in Table 1.

TABLE 1

| Sample No. | Time of wet mixing (hours) | Heat treatment time (hours) | Ra (μm) | Rmax (μm) | Relative value of the number of particles generated |
| --- | --- | --- | --- | --- | --- |
| 1 | 65 | — | 0.8 | 8 | 1 |
| 2 | 50 | 2 | 1 | 35 | 0.33 |
| 3 | 52 | — | 2.1 | 12 | 0.9 |
| 4 | 45 | — | 2.2 | 30 | 0.4 |
| 5 | 42.5 | 3 | 2.2 | 74 | 0.2 |
| 6 | 40 | 4 | 2.3 | 130 | 0.6 |
| 7 | 35 | 7 | 2.4 | 142 | 0.9 |
| 8 | 45 | 5 | 3 | 38 | 0.33 |
| 9 | 45 | 6 | 4.1 | 45 | 0.9 |

As shown in Table 1, regarding the sample Nos. 2, 4 to 6, and 8 having the arithmetic average roughness Ra of the inner peripheral surface is 1 μm or more and 3 μm or less, and having the arithmetic height Rmax of 30 μm or more and 130 μm or less, the generation of particles was less than that of the sample Nos. 1, 3, 7, and 9 in which the arithmetic average roughness Ra or the arithmetic height Rmax was out of the above-described range.

Example 2

The sample No. 4 shown in Example 1 was subjected to heat treatment at the temperature raising rate of 100° C./hour, the heat treatment temperature of 1400° C., the holding time as shown in Table 1, and the temperature lowering rate of 100° C./hour, and thereby sample Nos. 10 to 13 which are members for a plasma processing device were obtained.

Then, using the same method as shown in Example 1, the number of particles generated from each sample is shown as a relative value when the number of particles generated from the sample No. 1 shown in Example 1 is 1.

Further, the arithmetic average roughness Ra and the arithmetic height Rmax of the inner peripheral surface of each sample were measured using the same method as shown in Example 1, and the values are shown in Table 2.

The kurtosis Rku on the inner peripheral surface of each sample was determined using the laser microscope VK-9500 conforming to JIS B 0601: 2001 and manufactured by Keyence Corporation. As measurement conditions, the measurement mode was set to color super-depth, the measurement magnification to 400 times, the measurement range per location to 112 μm×84 μm, the measurement pitch to 0.05 μm, the cutoff filter λs to 2.5 μm, and the cutoff filter λc to 0.08 mm, and the measurement locations to 8 locations, whereby average values of kurtosis Rku were obtained. The values are shown in Table 2.

TABLE 2

| Sample No. | Heat treatment time (hours) | Ra (μm) | Rmax (μm) | Average value of Rku | Relative value of the number of particles generated |
| --- | --- | --- | --- | --- | --- |
| 10 | 1 | 2.3 | 34 | 5.8 | 0.28 |
| 11 | 2 | 2.4 | 35 | 6 | 0.26 |
| 12 | 3 | 2.5 | 38 | 5.2 | 0.24 |
| 13 | 4 | 2.6 | 40 | 6.4 | 0.22 |

It can be seen that when the average value of kurtosis Rku on the inner peripheral surface of the cylindrical body is 6.0 or more as in sample Nos. 11 to 13, the generation of particles is small.

DESCRIPTION OF THE REFERENCE NUMERAL

1: Chamber
2: Annular member
3: Member for a plasma processing device
3a: Through hole
3b: Outer peripheral surface
3c: Inner peripheral surface
3d: Crystal grain
4: Flange part
5: O-ring

The invention claimed is:
1. A member for a plasma processing device made of ceramics and having a shape of a cylindrical body with a through hole in an axial direction,
wherein the ceramics is mainly composed of aluminum oxide, and has a plurality of crystal grains and a grain boundary phase that is present between the crystal grains, and
wherein the cylindrical body has an inner peripheral surface having an arithmetic average roughness Ra of 1 μm or more and 3 μm or less, and an arithmetic height Rmax of 30 μm or more and 130 μm or less.
2. The member for a plasma processing device according to claim 1, wherein the inner peripheral surface of the cylindrical body has an average value of kurtosis Rku of 6.0 or more.
3. The member for a plasma processing device according to claim 1, wherein the inner peripheral surface of the cylindrical body has a projected part composed of aluminum oxide crystal grains, and a surface of the projected part is composed of a plurality of planes.

* * * * *